(12) United States Patent
Dilley et al.

(10) Patent No.: US 9,723,741 B2
(45) Date of Patent: Aug. 1, 2017

(54) HOUSING ARRANGEMENT OF A POWER ELECTRONICS DEVICE

(71) Applicant: VACON OYJ, Vaasa (FI)

(72) Inventors: Devin Dilley, Durham, NC (US); Marc Hoffman, Clayton, NC (US); Dan Isaksson, Durham, NC (US)

(73) Assignee: VACON OY, Vaasa (FI)

( * ) Notice: Subject to any disclaimer, the term of this patent is extended or adjusted under 35 U.S.C. 154(b) by 21 days.

(21) Appl. No.: 14/707,469

(22) Filed: May 8, 2015

(65) Prior Publication Data
US 2015/0342076 A1 Nov. 26, 2015

(30) Foreign Application Priority Data

May 23, 2014 (EP) ..................................... 14169592

(51) Int. Cl.
| | | |
|---|---|---|
| *H05K 7/02* | (2006.01) | |
| *H02M 7/00* | (2006.01) | |
| *H02M 5/458* | (2006.01) | |
| *H05K 7/06* | (2006.01) | |
| *H05K 7/10* | (2006.01) | |
| *H02M 5/297* | (2006.01) | |

(52) U.S. Cl.
CPC ............ *H05K 7/026* (2013.01); *H02M 5/297* (2013.01); *H02M 5/458* (2013.01); *H02M 7/003* (2013.01); *H05K 7/06* (2013.01); *H05K 7/1015* (2013.01)

(58) Field of Classification Search
CPC ........ H05K 7/026; H05K 7/06; H05K 7/1015; H02M 7/003; H02M 5/297; H02M 5/458; G06F 1/1601; G06F 1/1637; G06F 1/181; G06F 11/3044; G06F 2200/1631

USPC .................................................. 361/723–747
See application file for complete search history.

(56) References Cited

U.S. PATENT DOCUMENTS

| | | | | |
|---|---|---|---|---|
| 2003/0133267 A1* | 7/2003 | Beihoff | .................... | B60L 11/12 361/704 |
| 2010/0328848 A1* | 12/2010 | Ledezma | ................ | H02P 27/14 361/603 |
| 2010/0328883 A1* | 12/2010 | Ledezma | .............. | H02M 7/003 361/690 |
| 2012/0327602 A1* | 12/2012 | Kulkarni | ............... | H02M 7/003 361/700 |
| 2013/0100716 A1* | 4/2013 | Tong | ....................... | H02M 1/32 363/37 |

(Continued)

Primary Examiner — Anthony Haughton
Assistant Examiner — Yahya Ahmad
(74) Attorney, Agent, or Firm — Birch, Stewart, Kolasch & Birch, LLP

(57) ABSTRACT

A housing arrangement of a power electronics device includes one power module or several identical power modules, each module with at least one part connected to a hazardous voltage, the arrangement further including a housing part having room for at least one power module. Each power module includes an enclosure part which essentially surrounds the power module and includes electrically insulating material. All the external connections of the power module are placed on one single wall of the enclosure part. The power modules and the enclosure part of the power modules are arranged such that when the power module is installed to the housing part the power module is electrically insulated from the housing part and external connections of the power module are directed to the front side of the housing part.

20 Claims, 2 Drawing Sheets

(56) References Cited

U.S. PATENT DOCUMENTS

| | | | | |
|---|---|---|---|---|
| 2014/0035289 A1* | 2/2014 | Eichler | ................ | H05K 7/1432 |
| | | | | 290/55 |
| 2014/0146486 A1* | 5/2014 | Hammond | ............ | H02M 7/003 |
| | | | | 361/733 |
| 2014/0192496 A1* | 7/2014 | Tramet | ................. | H05K 7/1432 |
| | | | | 361/752 |
| 2014/0293663 A1* | 10/2014 | Ledezma | .............. | H02M 5/458 |
| | | | | 363/37 |

* cited by examiner

HOUSING ARRANGEMENT OF A POWER ELECTRONICS DEVICE

FIELD OF THE INVENTION

The present invention relates to a housing arrangement of an electronics device. More particularly the invention is related to a housing arrangement of an enclosed power electronics device, especially in a medium voltage environment.

BACKGROUND OF THE INVENTION

It is known in the art that in high power applications (e.g. over 1 MW), a medium voltage (i.e. higher than 1 kV) presents certain advantages over the low voltage in heavy-duty electric machines, due to lower current levels. In case that the shaft rotational speed needs to be controlled, a speed controller, such as a frequency converter, naturally needs to be designed for the same medium voltage level.

To ensure the user safety and the functional safety of the electric circuit, the hazardous parts of the devices connected to an electricity network must be protected in accordance with international safety standards like UL347A and IEC61800-5-1. The safety is ensured by arranging sufficient electric isolation around the live parts by using clearances, creepage distances or barriers made of an insulating material.

In power electronic constructions, the heat sink or other metal structure often works as a base element (of e.g. a power module), whereto the power components, supports for bus bars, insulating shrouds etc. are attached. When using typical, traditional and today common mounting methods, the power electronics device is placed inside a conductive metal housing that is grounded for safety reasons. In case of e.g. a power electric apparatus, like in examples of FIGS. 1 and 2, this means that every energized component or power module requires separation from the frame parts and walls of the housing etc. by long clearances and tall standoff insulators, thereby requiring substantial volume within the electric device to accomplish the required isolation. In addition, e.g. in service situations, a special care must be taken to ensure the integrity of the isolation arrangements and that no electrical faults or clearance violations occur to the housing of the power electric device.

SUMMARY OF THE INVENTION

The object of the present invention is to avoid the problems of prior art by presenting a solution that minimizes the size of a power electronics device, consisting of one module or several identical power modules and working especially in a medium voltage environment. This is implemented by mounting the energized components of the power module within enclosure parts that have been made substantially of an insulating material. In this way no wide clearances or creepage distances are necessary between the modules at different potentials or between the modules and the grounded support frame of the housing part wherein the power modules have been mounted. Thus the arrangement according to the present invention minimizes the total size of the electronic device.

According to an embodiment of the invention, all external connections of the power module are placed on one single side of the power module, advantageously on the front side. If the connections are on the front side of the power module, i.e. on the side facing the doors of the housing part when the power module is installed to the housing part, the connections are visible, easy to assemble and check when the door of the housing part is open. Due to insulating enclosure material no free space is required on other sides of the module than the side where the connections are located, which minimizes the required dimensions of the housing part wherein the power module(s) are mounted.

According to an embodiment of the invention the power module may be equipped with slide bars on opposite exterior sides in order to facilitate easy assembly inside the housing.

According to an embodiment of the invention the modules are cooled by liquid, thus minimizing the sizes of the cooler and the whole module.

The present invention can be applied to all power electronics devices that need to be isolated from their metal housing parts. The most advantageous scope of application is equipment in a medium voltage environment according to e.g. the examples of FIGS. 1 and 2. Still the invention is not restricted to medium voltage level only but can be applied in low voltage environment, too.

The invention is defined in more detail in the present description and the following examples of embodiment. The scope of protection is defined in the independent claims and the preferred embodiments in other claims.

BRIEF DESCRIPTION OF THE FIGURES

In the following, preferred embodiments of the present invention will be described in detail by reference to the enclosed drawings, wherein.

DETAILED DESCRIPTION OF THE PREFERRED EMBODIMENTS

Figure 1:
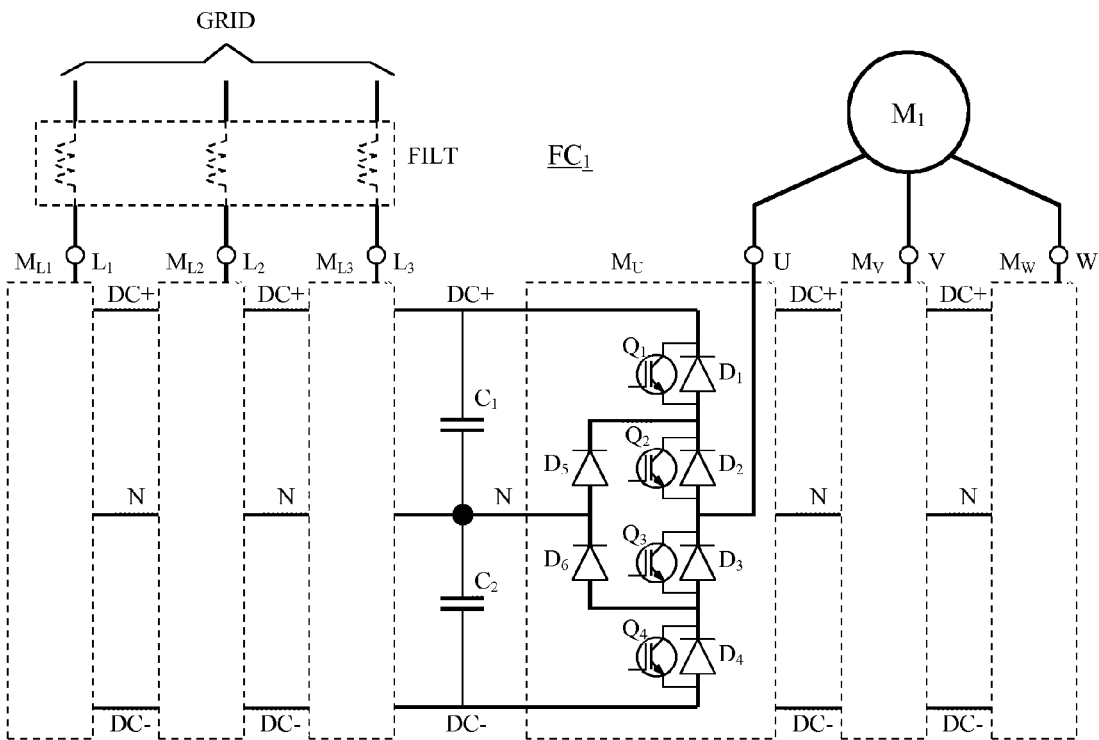
FIG. 1 presents a main diagram of a modular electric device.

FIG. 1 presents in a simplified form a main diagram of a medium voltage motor drive, consisting of a frequency converter $FC_1$ and a motor $M_1$. The frequency converter includes 6 identical power modules $M_{L1} \ldots M_{L3}$, $M_U \ldots M_W$, intermediate DC-bus capacitors $C_1$, $C_2$, and a line filter FILT. Each module includes in this example, known as the so-called NPC (neutral point clamped) topology, the power electric components shown by the module $M_U$ (4 IGBT switches $Q_1 \ldots Q_4$ and 6 diodes $D_1 \ldots D_6$). The frequency converter of this type is able to convert the voltage of the supplying grid, with fixed voltage and frequency, into the output voltage U, V, W with variable voltage and frequency, for supplying power to the motor $M_1$. In this case the grid side converter, consisting of modules $M_{L1} \ldots M_{L3}$, is regenerative, being able to supply power in both directions.

Figure 2:
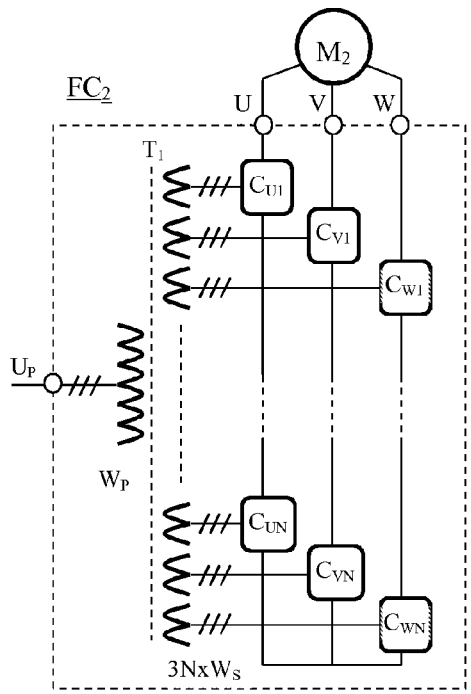
FIG. 2 presents a main diagram of another modular electric device.

FIG. 2 presents in a simplified form a single-line main diagram of another type of a medium voltage motor drive, consisting of a frequency converter $FC_2$, known from e.g. patent publication U.S. Pat. No. 5,625,545, and a motor $M_2$. The frequency converter in this case includes a main transformer $T_1$, having one primary winding $W_P$ and 3N secondary windings $W_S$, for transforming the input three-phase medium voltage $U_P$ into several isolated output low voltages for identical power cells $C_{U1} \ldots C_{WN}$. In each output phase (U, V, W) of the frequency converter the low voltage power cells are arranged in cascade connection (e.g. $C_{U1} \ldots C_{UN}$ in U-phase) in order to achieve the required voltage level for supplying the motor $M_2$.

Figure 3:
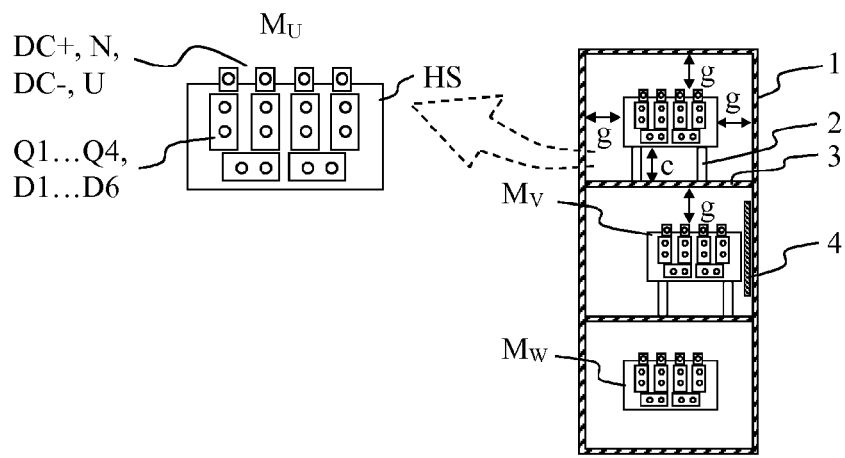
FIG. 3 illustrates a prior art housing arrangement of power modules.

FIG. 3 illustrates an example of the mechanical implementation of a power cell, like introduced in FIGS. 1 and 2, and the housing arrangement of power cells inside a cabinet according to the prior art. For clarity reasons the drawing is simplified, presenting only the front view and those parts which are essential from the idea explanation point of view.

The left hand part of the figure illustrates the main parts of an exemplary power cell $M_U$. In the cell, the power electric components (IGBT-switches $Q_1 \ldots Q_4$, diodes $D_1 \ldots D_6$) and external connectors DC+, DC−, N, U are mounted on a heat sink HS. The right hand part of the figure illustrates how the power modules $M_U \ldots M_W$ may be mounted inside a cabinet 1. Because the power modules are live, i.e. at hazardous electric potential, they are isolated from the grounded cabinet parts by standoff insulators 2 which are fixed to the baffle plates 3. According to the isolation rules given in safety standards, there must be certain minimum clearances g from the cell to the grounded housing part 1 in all directions, and certain minimum creepage distances c on surface of the standoff insulators between the cell and the baffle plates 3. If there is an insulator plate 4 between the cell and the wall of the cabinet, the cell can be placed closer to the grounded wall of the cabinet, like is illustrated by $M_V$ assembly.

As is evident, a frequency converter of the example of FIG. 1 needs another similar cabinet for the grid side power modules $M_{L1} \ldots M_{L3}$.

Figure 4:
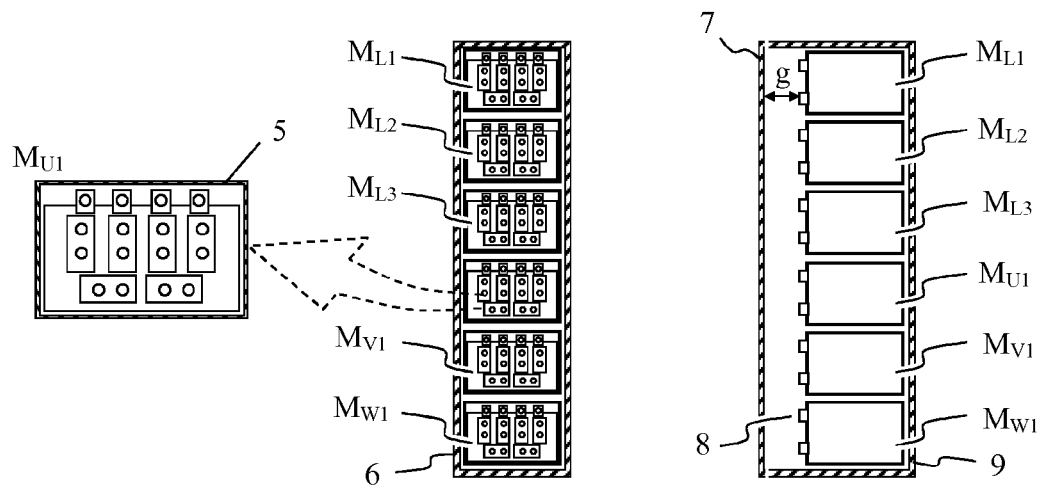
FIG. 4 illustrates a housing arrangement of power modules according to the present invention.

FIG. 4 illustrates an example of the mechanical implementation of a power module, e.g. a power cell, and its housing arrangement inside a housing part, e.g. a cabinet, according to the present invention. The drawing is simplified similarly to FIG. 3.

As is illustrated in the left hand part of the figure, the power electric components and parts of the power module $M_{U1}$ (containing the same main parts as those explained above in FIG. 3) are placed inside an enclosure part 5, which is composed of electrically insulating material. According to an advantageous embodiment of the invention, all external connections of the power module are arranged on one single wall of the enclosure part 5, and the other walls are solid, essentially without openings. In the example of FIG. 4, the external connections and thus all necessary openings for the external connections are placed on the front side. By this arrangement all power modules $M_{L1} \ldots M_{W1}$ of a frequency converter, like presented e.g. in FIG. 1, can be assembled inside a metal housing part 6 tight, principally without any isolation gaps between the power modules or from power modules to a their support frame or to the walls of the housing part.

Due to the insulated enclosure part the isolation gaps from live electric components to the inner wall of the enclosure part are allowed to be dimensioned on functional basis instead of safety basis. Thus these isolation distances may be very short, even null.

Due to the elimination of wide isolation gaps on both sides of the enclosure part walls, the whole modular equipment can be mounted inside a much narrower housing part section than according to the prior art technology, as is obvious according to the middle part of the FIG. 4. The right hand part of FIG. 4 includes a side view on how the power modules $M_{L1} \ldots M_{W1}$ may be assembled inside a housing part according to this example of the present invention. Due to the insulated enclosure material, the modules can be placed close to the back wall 9 of the housing part without isolation gaps, thus minimizing the required depth dimension of the housing part. In this exemplary case an isolation distance g is necessary only between the metal door 7 of the housing part and the module external connection 8.

Figure 5:
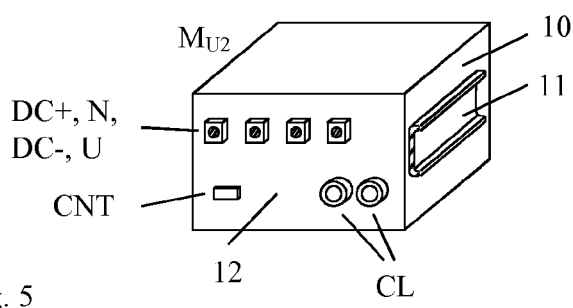
FIG. 5 presents a housing arrangement of a power module according to the present invention.

FIG. 5 illustrates a perspective sketch of an example of a mechanical implementation of the power module $M_{U2}$ according to the present invention, seen from the front side. According to the housing part mounting example of FIG. 4, the front side of the power module is advantageously directed toward the housing part door. The power module has all external connections on the front wall 12 (main circuit connections DC+, DC−, N, U, control connection CNT and liquid cooling connections CL), which means that the solid insulation of the enclosure part 10 around the live parts needs to be open only at that one front wall 12. For easy assembling to the housing part, drawer slide bars 11 may be mounted on both exterior side walls of the enclosure part 10. The counterparts (not shown) of the slide bars 11 are in this case mounted on the side walls of the housing part.

While the invention has been described with reference to the previous embodiment, it should be recognized that the invention is not limited to this embodiment, and many modifications and variations will become apparent to persons skilled in the art without departing from the scope and spirit of the invention, as defined in the appended claims.

The invention claimed is:

1. A housing arrangement of a power electronics device, comprising one power module or several identical power modules, each module having at least one part connectable to a hazardous voltage, the arrangement further comprising a housing part having room for at least one power module, wherein:
    each individual power module including an enclosure part which essentially surrounds the power module with electrically insulating material substantially surrounding the enclosure part of each individual power module wherein each individual power module is electrically insulated when installed within the housing part and each individual power module is electrically insulated when removed from the housing part, and
    all the external connections of the power module are placed on one single wall of the enclosure part, and the external connections of the power module are directed to the front side of the housing part.

2. A housing arrangement according to claim 1, wherein the enclosure part of the power module is entirely composed of electrically insulating material.

3. A housing arrangement according to claim 1 wherein the enclosure part essentially surrounds the electric parts of the power module such that all holes for external connections through the enclosure wall are placed on one wall.

4. A housing arrangement according to claim 1, wherein the power module comprises external connections such as main circuit connections, control connection, and/or connections to a liquid cooling circulation.

5. A housing arrangement according to claim 1, wherein the enclosure part of the power module further comprises slide bars arranged on two opposite exterior sides of the enclosure part of the power module and the housing part comprises counterparts of slide bars of the power module.

6. A housing arrangement according to claim 1, wherein the power electronics device is configured to be connected to a medium voltage supply.

7. A housing arrangement according to claim 2 wherein the enclosure part essentially surrounds the electric parts of the power module such that all holes for external connections through the enclosure wall are placed on one wall.

8. A housing arrangement according to claim 2, wherein the power module comprises external connections such as main circuit connections, control connection, and/or connections to a liquid cooling circulation.

9. A housing arrangement according to claim 3, wherein the power module comprises external connections such as main circuit connections, control connection, and/or connections to a liquid cooling circulation.

10. A housing arrangement according to claim 2, wherein the enclosure part of the power module further comprises slide bars arranged on two opposite exterior sides of the enclosure part of the power module and the housing part comprises counterparts of slide bars of the power module.

11. A housing arrangement according to claim 3, wherein the enclosure part of the power module further comprises slide bars arranged on two opposite exterior sides of the enclosure part of the power module and the housing part comprises counterparts of slide bars of the power module.

12. A housing arrangement according to claim 4, wherein the enclosure part of the power module further comprises slide bars arranged on two opposite exterior sides of the enclosure part of the power module and the housing part comprises counterparts of slide bars of the power module.

13. A housing arrangement according to claim 2, wherein the power electronics device is configured to be connected to a medium voltage supply.

14. A housing arrangement according to claim 3, wherein the power electronics device is configured to be connected to a medium voltage supply.

15. A power module of a power electronics device, with at least one part connectable to a hazardous voltage, wherein the power module is adapted to be installed in a housing part having room for at least one power module, the power module includes an enclosure part which essentially surrounds the power module with electrically insulating material substantially surrounding the enclosure part of the power module, and the power module and the enclosure part of the power module are arranged such that when the power module is installed in the housing part the power module is electrically insulated from the housing part, and when the power module is removed from the housing part the power module is electrically insulated, and external connections of the power module are directed to the front side of the housing part.

16. A power module according to claim 15, wherein the isolation distance from a power electric component to the inner wall of the enclosure part is null.

17. A power module according to claim 15, wherein the enclosure part of the power module is entirely composed of electrically insulating material.

18. A power module according to claim 15, wherein the enclosure part essentially surrounds the electric parts of the power module such that all holes for external connections through the enclosure wall are placed on one wall.

19. A power module according to claim 15, wherein the power module comprises external connections such as main circuit connections, control connection, and connections to a liquid cooling circulation.

20. A power module according to claim 15, wherein the enclosure part of the power module further comprises slide bars arranged on two opposite exterior sides of the enclosure part of the power module.

\* \* \* \* \*